(12) United States Patent
Yamamoto (10) Patent No.: US 7,528,031 B2
(45) Date of Patent: May 5, 2009

(54) SEMICONDUCTOR DEVICE AND METHOD FOR MANUFACTURING THE SAME

(75) Inventor: Tomonari Yamamoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 225 days.

(21) Appl. No.: 11/515,874

(22) Filed: Sep. 6, 2006

(65) Prior Publication Data

US 2007/0007619 A1 Jan. 11, 2007

Related U.S. Application Data

(62) Division of application No. 10/994,336, filed on Nov. 23, 2004, now Pat. No. 7,119,412.

(30) Foreign Application Priority Data

Jul. 5, 2004 (JP) ............................. 2004-198424

(51) Int. Cl.
*H01L 21/8238* (2006.01)
(52) U.S. Cl. ................................. 438/221; 257/E21.546
(58) Field of Classification Search ................. 438/221; 257/E21.546
See application file for complete search history.

(56) References Cited

U.S. PATENT DOCUMENTS

| 5,578,518 | A | 11/1996 | Koike et al. |
| 6,746,936 | B1 * | 6/2004 | Lee .............................. 438/445 |
| 6,913,969 | B2 * | 7/2005 | Yoo ............................. 438/248 |
| 2005/0085042 | A1 | 4/2005 | Chun et al. |

* cited by examiner

*Primary Examiner*—Lex Malsawma
(74) *Attorney, Agent, or Firm*—Westerman, Hattori, Daniels & Adrian, LLP.

(57) ABSTRACT

After formation of a gate insulating film for a high voltage transistor on the entire surface, when removing the gate insulating film existing within a low voltage region, etching is not finished upon expose of an active region, but over etching is performed until the surface of an element isolation insulating film becomes lower by, for example, about 15 nm than the surface of the active region within the low voltage region. Then, a high-temperature rapid thermal hydrogen treatment is performed on the active region within the low voltage region. As a result of this, a natural oxide film is removed from the surface of the active region within the low voltage region, so that the flatness is increased and its corners are rounded.

11 Claims, 14 Drawing Sheets

LOW VOLTAGE REGION | HIGH VOLTAGE REGION

FIG. 5B

LOW VOLTAGE REGION | HIGH VOLTAGE REGION

FIG. 5C

LOW VOLTAGE REGION | HIGH VOLTAGE REGION

HIGH VOLTAGE REGION

FIG. 10B

HIGH VOLTAGE REGION

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2004-198424, filed on Jul. 5, 2004, the entire contents of which are incorporated herein by reference.

This application. is a divisional of U.S. application Ser. No. 10/994,336 filed on Nov. 23, 2004.

BACKGROUND OF THE INVENTION

1. Field of the Invention

The present invention relates to a semiconductor device in which an on-current of a transistor is increased and a method for manufacturing the same.

2. Description of the Related Art

In recent years, miniaturization of a semiconductor device is in progress, in which the on-current of an MOS transistor constituting a semiconductor device may be insufficient.

On the other hand, it has been reported that by performing a high-temperature rapid thermal hydrogen treatment (RTH) on an active region before formation of a gate oxide film of a MOS transistor, a natural oxide film existing within the active region can be removed and the flatness can be increased (VLSI symposium 2001, p79-80).

However, it is difficult to obtain a sufficient on-current even if the above-described RTH is performed.

SUMMARY OF THE INVENTION

An object of the present invention is to provide a semiconductor device in which a sufficient on-current of a transistor can be ensured even when miniaturization is advanced and a method for manufacturing the same.

As a result of earnest studies to solve the above problems, the present inventor has devised various aspects of the invention described below.

According to an aspect of the present invention, there provided is a semiconductor device which includes a semiconductor substrate and an element isolation insulating film formed on a surface of the semiconductor substrate which defines a first active region; and a first field effect transistor formed within the first active region. A surface of the element isolation insulating film is at a position lower than a surface of the first active region, and an edge portion of the first active region is rounded.

According to another aspect of the present invention, there provided is a method for manufacturing a semiconductor device. In the method, an element isolation insulating film for defining a first active region is formed on a surface of a semiconductor substrate, thereafter a surface of the element isolation insulating film is lowered than a surface of the first active region. Then, a high-temperature rapid thermal hydrogen treatment is performed on the first active region. Thereafter, a first field effect transistor is formed within the first active region.

DETAILED DESCRIPTION OF THE PREFERRED EMBODIMENTS

Outline of the Present Invention

First, the outline of the present invention will be described. FIGS. 1A and 1B and FIGS. 2A and 2B are cross-sectional views showing the outline of the present invention.

Figure 2A:
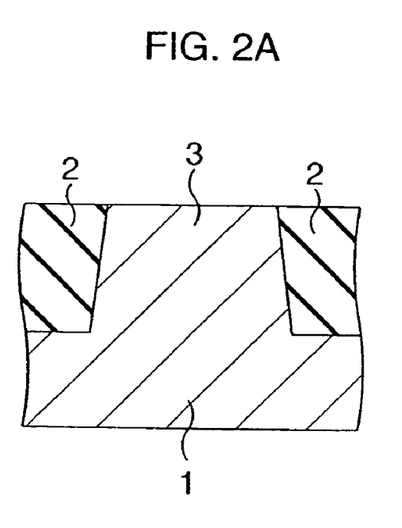
FIGS. 2A and 2B are cross-sectional views also showing the outline of the present invention.
Figure 2B:
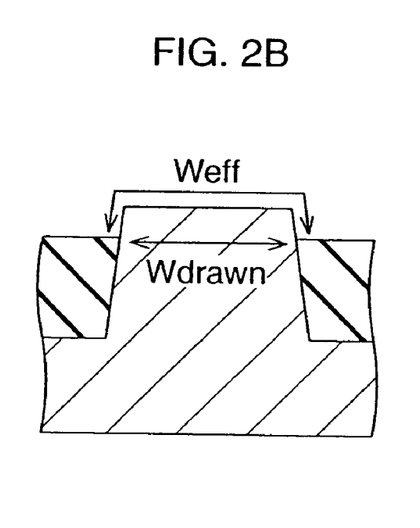

One of the causes of a reduction in the on-current can be a decrease in gate width associated with the miniaturization. Hence, there is one conceivable method for restraining the decrease in the gate width, in which an element isolation insulating film is formed on the surface of a semiconductor substrate by STI (Shallow Trench Isolation) and thereafter the element isolation insulating film is excessively etched to form a step between the surface of the element isolation insulating film and the surface of the active region. More specifically, generally, when an element isolation insulating film 2 is formed on the surface of a Si substrate 1 by STI, the surface of an active region 3 defined by the element isolation insulating film 2 is on about the same level as the surface of the element isolation insulating film 2 as shown in FIG. 2A. In contrast to this, when the surface of the element isolation insulating film 2 is lowered by performing overetching on the element isolation insulating film 2 as shown in FIG. 2B, an effective gate width (Weff) becomes larger than a design gate width (Wdrawn), resulting in a larger on-current.

However, the formation of only the step is not enough, and an electric field concentration occurs at a corner portion of the active region. This results in operation of a parasitic transistor, degradation in the reliability of the gate insulating film, or the like.

Figure 1A:
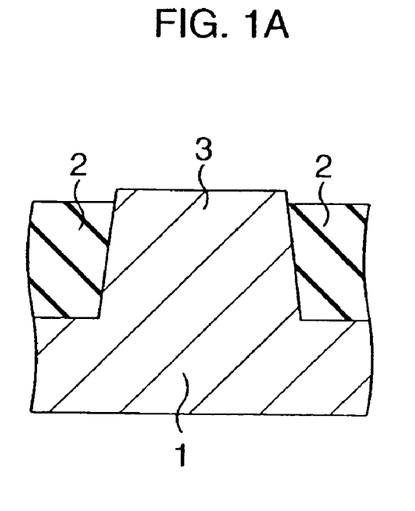
FIGS. 1A and 1B are cross-sectional views showing an outline of the present invention.
Figure 1B:
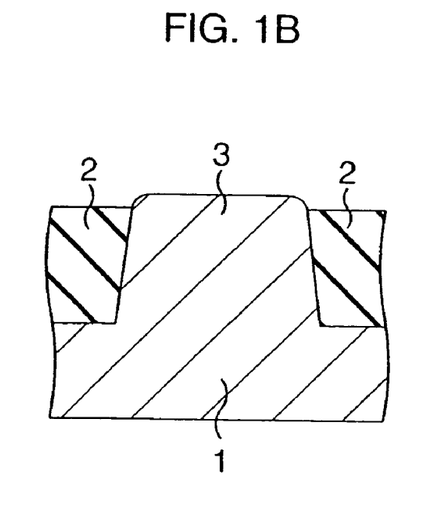

As a result of earnest studies to solve the above problems, the present inventor has found that the electric field concentration can be prevented by performing overetching on the element isolation insulating film 2 and thereafter performing a high-temperature thermal hydrogen treatment (RTH) on the active region 3. More specifically, when a step is first formed as shown in FIG. 1A and RTH is then performed, the corners of the active region 3 are rounded as shown in FIG. 1B. Conventionally, the removal of a natural oxide film and planarization of the surface by RTH have been reported, but such a phenomenon that the corners are rounded has not been known. One of the reasons why the corners are rounded may be occurrence of surface diffusion of Si atoms existing on the surface of the active region 3. Then, the corners rounded as described above suppress occurrence of the electric field concentration. In addition, in synergy with the overetching, more Si atoms move during RTH, so that the effective gate width (Weff) easily increases. The present inventor has found the phenomenon described above and devised that the above phenomenon can be utilized to increase the effective gate width while restraining the electric field concentration, so as to obtain a larger on-current.

Here, the result of an experiment that the present inventor has actually carried out will be described. In this experiment, CMOS transistors comprising two kinds of transistors different in thickness of the gate oxide film were produced by two kinds of methods trough use of a so-called multi-oxide process. More specifically, in the methods, a thick film transistor having a gate oxide film with a thickness of about 5.0 nm and a thin film transistor having a gate oxide film with a thickness of about 1 nm to about 2 nm were formed on the same chip. In these methods, the gate oxide film for the thick film transistor was formed within each formation region of the thick film transistor and the thin film transistor, and then the gate oxide film for the thick film transistor existing within the formation region of the thin film transistor was removed using hydrofluoric acid. Subsequently, the gate oxide film for the thin film transistor was formed within the formation region of the thin film transistor. Incidentally, in this experiment, overetching was intentionally performed during wet etching to remove the gate oxide film for the thick film transistor. In one of the methods, etching by 8.5 nm in thermal oxide film was performed and, in the other method, etching by 6.0 nm in thermal oxide film was performed. As the thickness of the gate oxide film is 5.0 nm, the former is overetching by 70% (3.5 nm) and the latter is overetching by 20% (1.0 nm). Note that an HDP (High Density Plasma) oxide film was formed as the element isolation insulating film.

Figure 3:
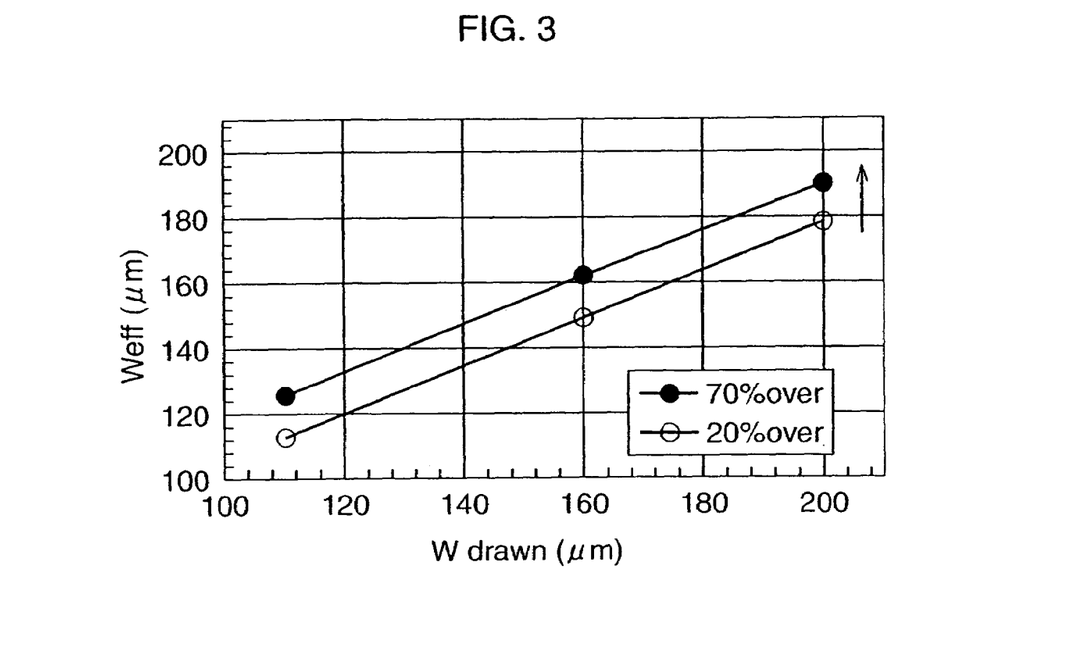
FIG. 3 is a graph showing the relation between a design gate width and an effective gate width.

Then, the effective gate width (Weff) of each of the transistors produced by the above-described methods was measured. The results of them are shown in FIG. 3. As described above, the difference in overetching is 2.5 nm in thermal oxide film, but the HDP oxide film is etched at a rate of about 1.5 times faster than that of the thermal oxide film, and therefore the difference in the etching amount of the element isolation insulating film is estimated about 4 nm. Further, since the difference to this degree occurs at both ends in the width direction of the gate, the difference in the effective gate width (Weff) is considered to be about 8 nm. According to the actual measurement, however, a difference of 10 nm or more occurred as shown in FIG. 3. This also corroborates that the area of the active region exposed to the outside is increased by the overetching and thus more Si atoms move during RTH.

Figure 4:
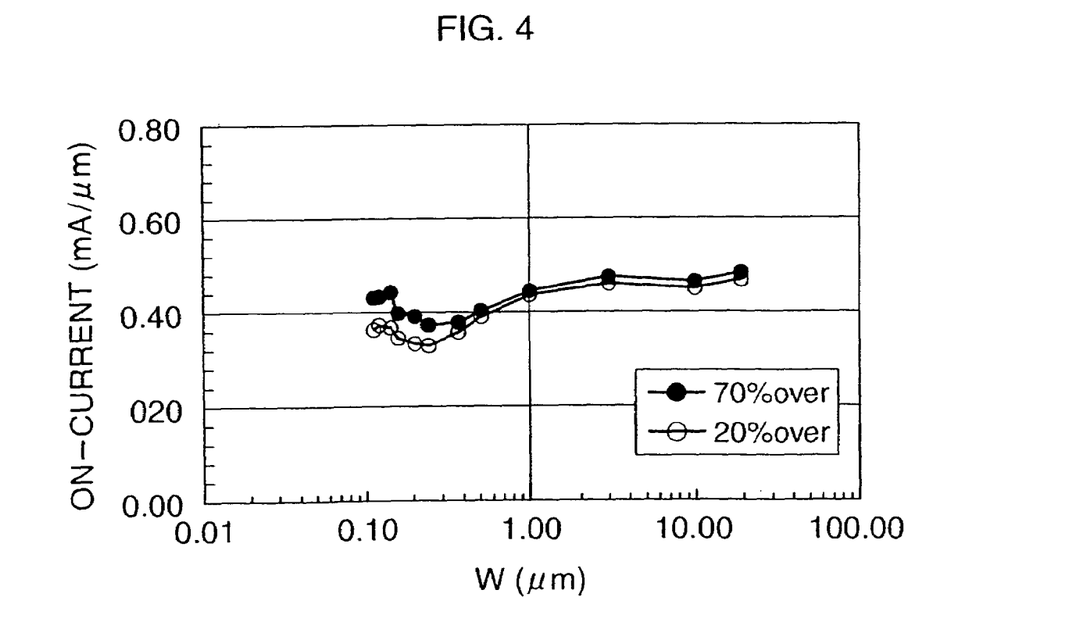
FIG. 4 is a graph showing the relation between the design gate width and an on-current.

Further, the on-current of each of the transistors produced by the above-described two kinds of methods was measured to return the result shown in FIG. 4. The vertical axis of the graph shown in FIG. 4 indicates the on-current per 1 μm of the design gate width (Wdrawn). As shown in FIG. 4, the sample which was produced by the method with more overetching resulted in a larger on-current. This tendency was more prominent in the narrower gate width in particular. Note that the step in the transistors to be measured was 15 nm in the transistor subjected to overetching by 70% and 11 nm in that subjected to overetching by 20%.

As described above, the step is formed between the element isolation insulating film and the active region and RTH is performed, whereby the effective gate width can be increased while restraining the electric field concentration to obtain a larger on-current.

Hereinafter, embodiments of the present invention will be concretely described with reference to the accompanying drawings. Note that the configuration of a semiconductor device will be described in conjunction with a manufacturing method thereof.

First Embodiment

Figure 6:
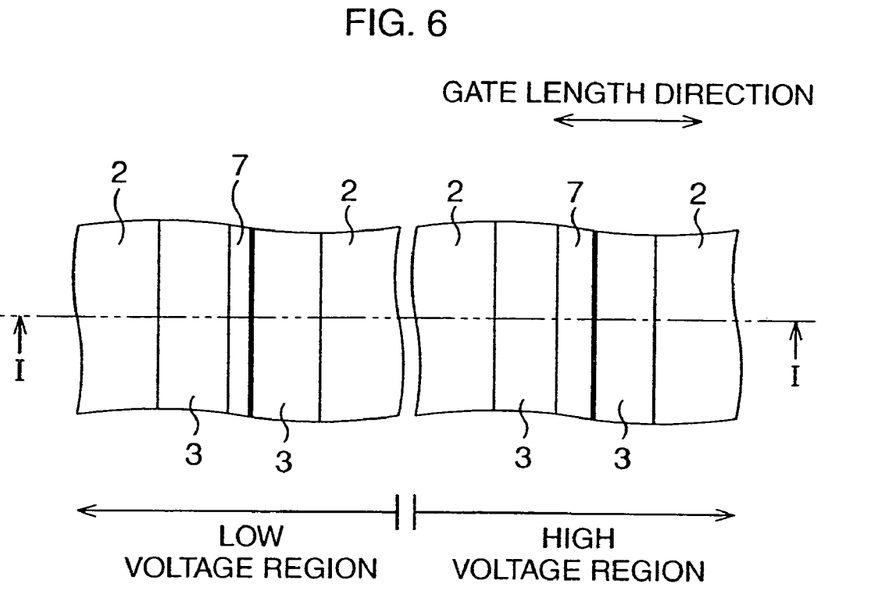
FIG. 6 is a plan view of the cross section shown in FIG. 5G.
Figure 7:
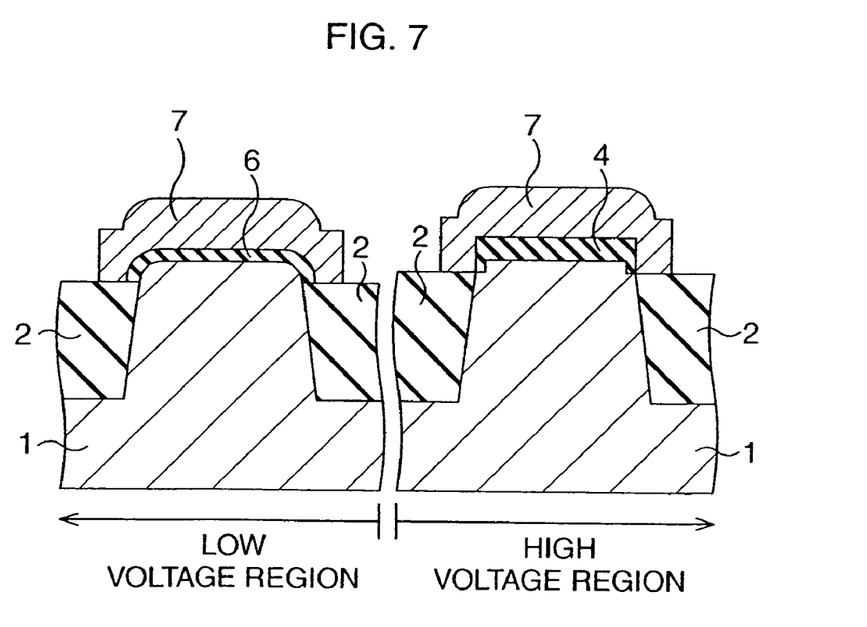
FIG. 7 is a cross-sectional view showing a cross section perpendicular to the cross section shown in FIG. 5G.
Figure 8:
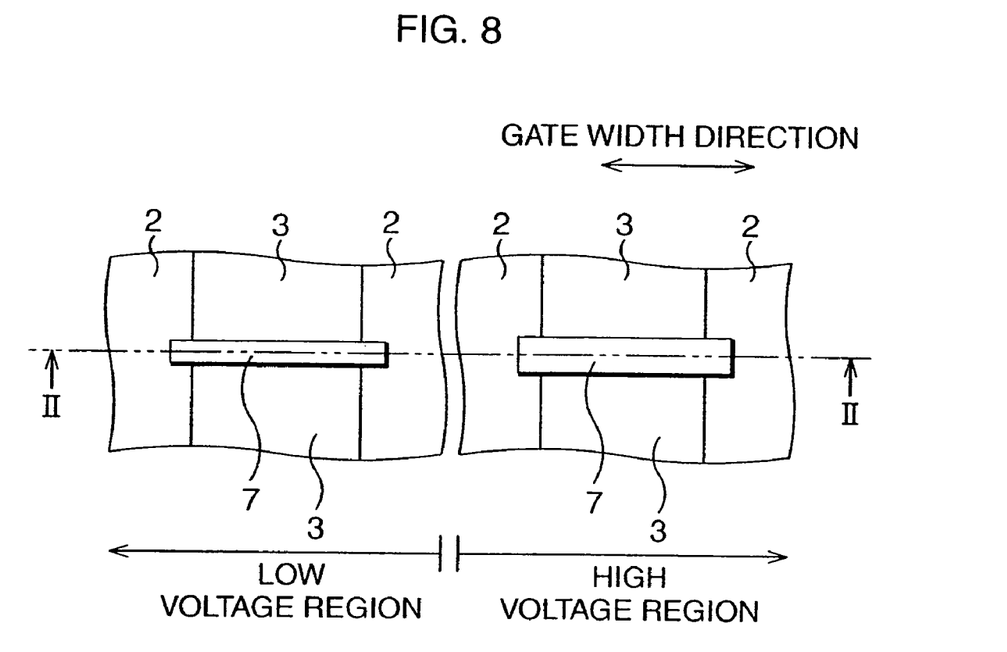
FIG. 8 is a plan view of the cross section shown in FIG. 7.

First, a first embodiment of the present invention will be described. FIG. 5A to FIG. 5J are cross-sectional views showing a method for manufacturing a semiconductor device according to the first embodiment of the present invention in the order of process steps. Besides, FIG. 6 is a plan view of the cross section shown in FIG. 5G, and the cross section taken along a I-I line in FIG. 6 is FIG. 5G. FIG. 7 is a cross-sectional view showing the cross section perpendicular to the cross section shown in FIG. 5G. FIG. 8 is a plane view of the cross section shown in FIG. 7, and the cross section taken along a II-II line in FIG. 8 is FIG. 7.

In the first embodiment, a semiconductor device including two kinds of MOS transistors different, for example, in thickness of the gate insulating film are manufactured. A region where a MOS transistor including a thin gate insulating film (a low voltage transistor) will be formed is referred to as a low voltage region, and a region where a MOS transistor including a thick gate insulating film (a high voltage transistor) will be formed is referred to as a high voltage region.

Figure 5A:
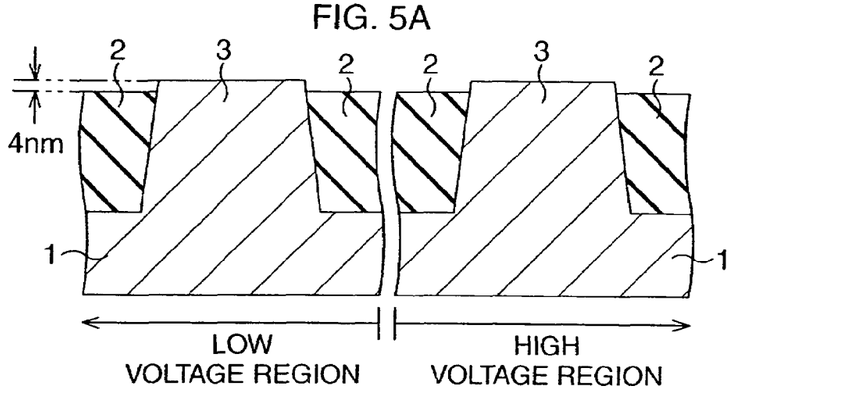
FIGS. 5A to 5J are cross-sectional views showing a method for manufacturing a semiconductor device according to a first embodiment of the present invention in the order of process steps.

In the first embodiment, first, as shown in FIG. 5A, element isolation insulating films 2 are formed on a semiconductor substrate, for example, a Si substrate 1 to thereby define active regions 3. In this event, the surfaces of the element isolation insulating films 2 may be at a position lower than the surfaces of the active regions 3 by, for example, about 4 nm.

Figure 5B:
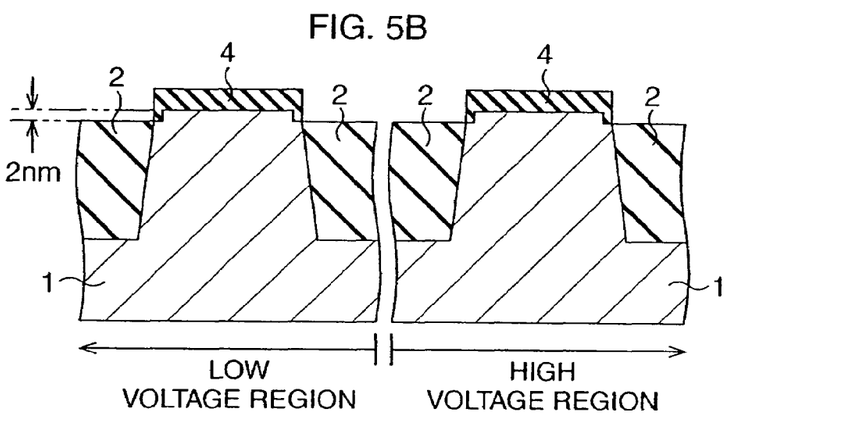

Next, as shown in FIG. 5B, gate insulating films 4 for the high voltage transistor are formed on the surfaces of the active regions 3 within the low voltage region and the high voltage region by thermal oxidation. The thickness of the gate insulating film 4 may be, for example, 5 nm. This thermal oxidation consumes Si existing on the surfaces of the active regions 3 by about 2 nm. Accordingly, the difference between the surface of the active region 3 and the surface of the element isolation insulating film 2 becomes about 2 nm.

Figure 5C:
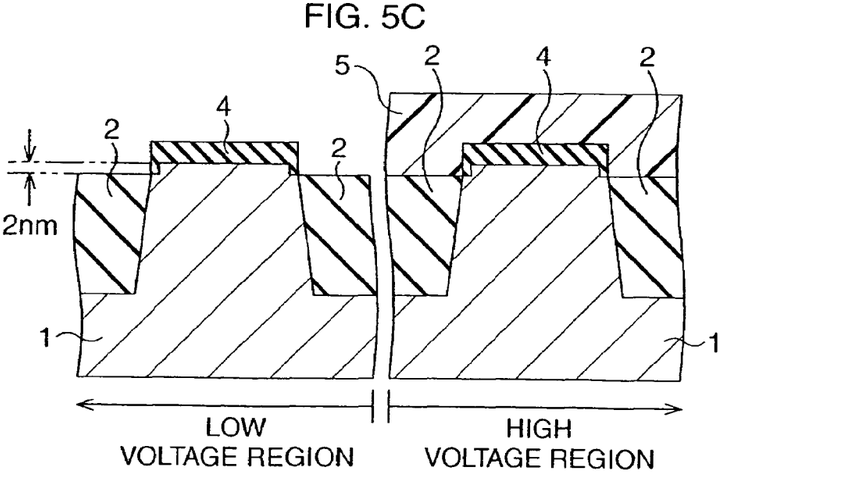

Then, as shown in FIG. 5C, a resist pattern 5 exposing the low voltage region and covering the high voltage region is formed.

Figure 5D:
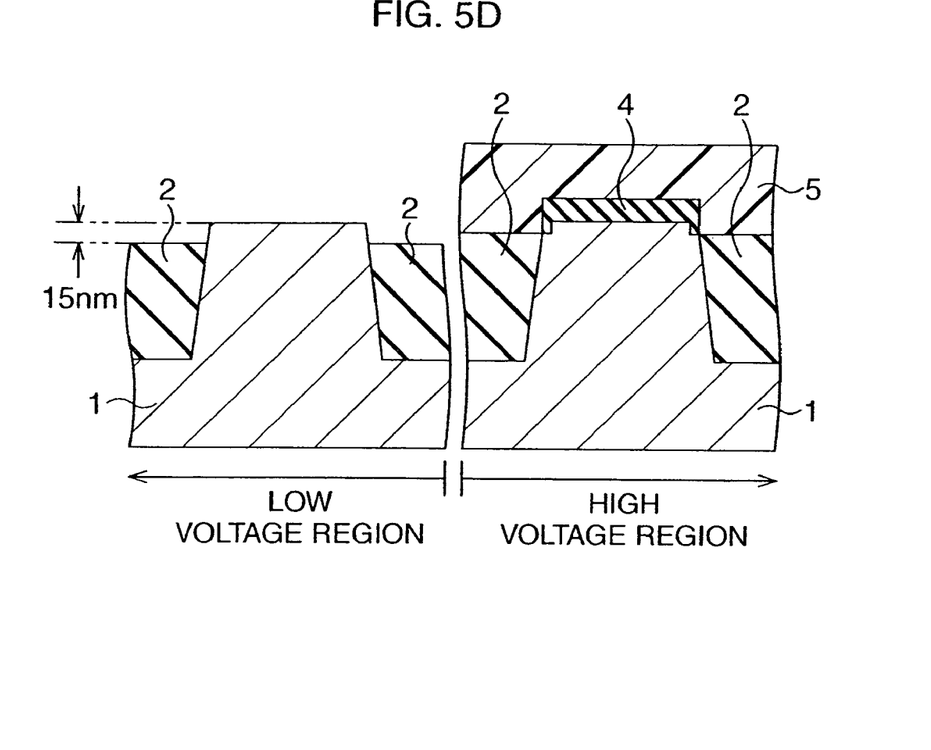

Thereafter, as shown in FIG. 5D, wet etching using, for example, hydrofluoric acid is performed with the resist pattern 5 used as a mask to thereby remove the gate insulating film 4 existing within the low voltage region. In this event, the etching is not finished upon exposure of the active region 3, but overetching is performed until the surface of the element isolation insulating film 2 becomes lower by, for example, about 15 nm than the surface of the active region 3 within the low voltage region. To perform such an overetching, it is only required to perform wet etching under the condition, for example, for removing the thermal oxidation film by 8.5 nm.

Figure 5E:
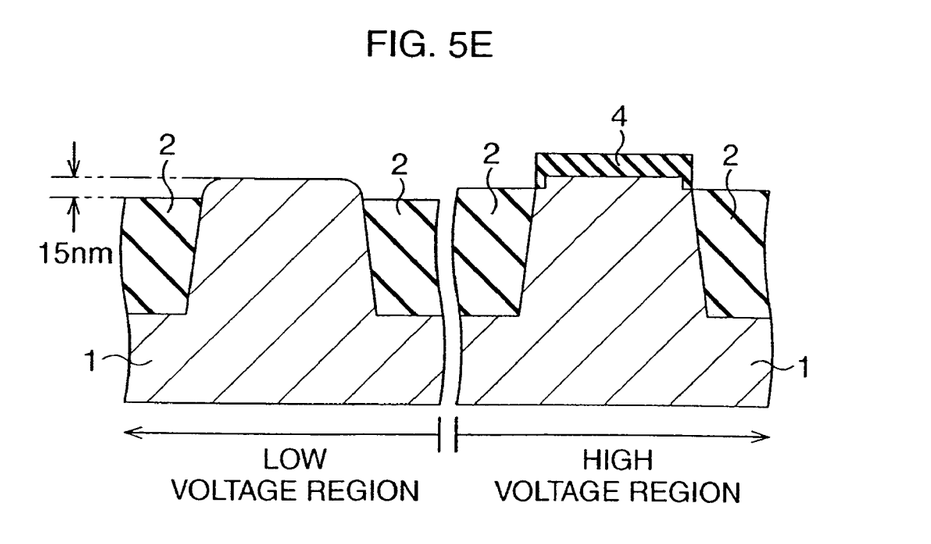

Subsequently, as shown in FIG. 5E, the resist pattern 5 is removed, and RTH is performed on the active region 3 within the low voltage region. As a result of this, a natural oxide film is removed from the surface of the active region 3 within the low voltage region so that the flatness of the active region 3 is increased, and its corners are rounded.

Figure 5F:
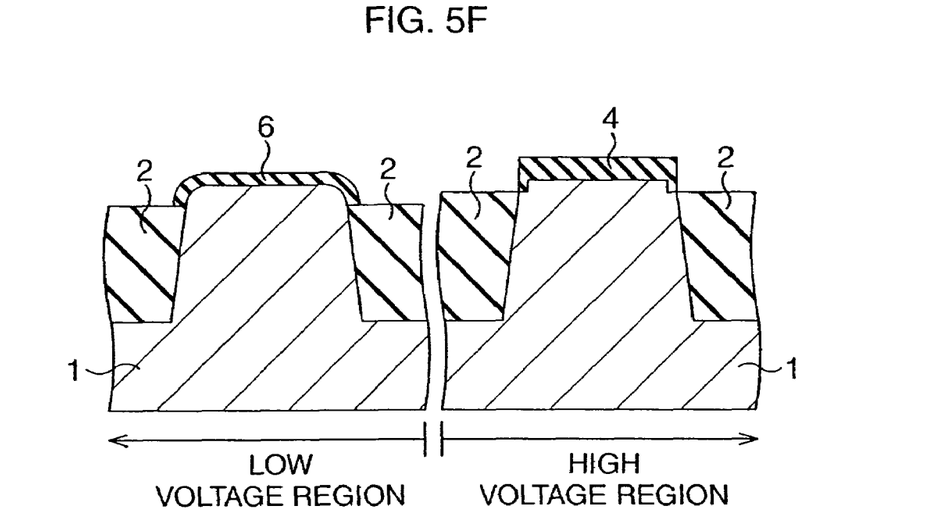
Figure 5G:
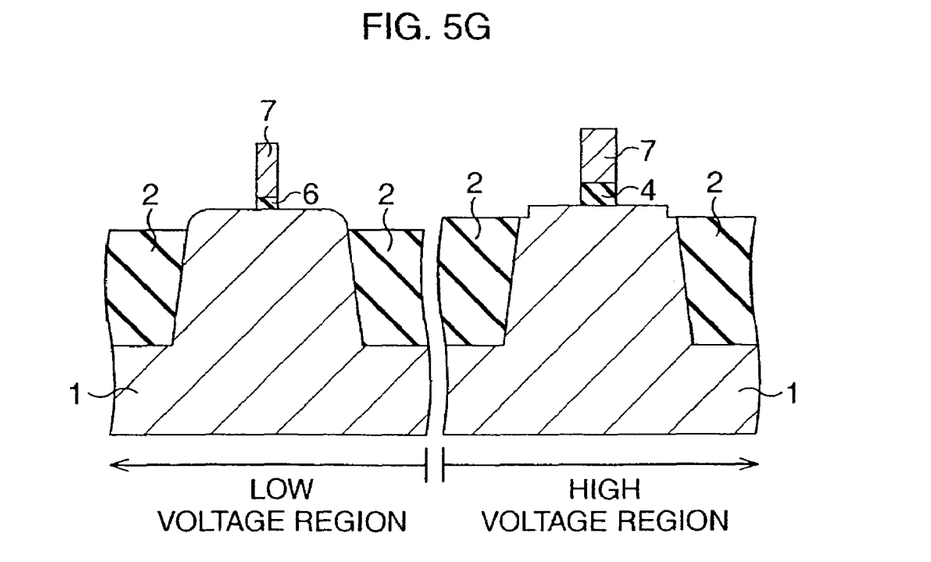

Then, as shown in FIG. 5F, a gate insulating film 6 for the low voltage operation transistor is formed on the surface of the active region 3 within the low voltage region by thermal oxidation. The thickness of the gate insulating film 6 may be, for example, 1.8 nm.

Subsequently, a poly-Si film is formed on the entire surface and patterned to thereby form gate electrodes 7 as shown in FIG. 5G and FIG. 6 to FIG. 8. In this event, the gate length of the gate electrode 7 for the high voltage transistor is made greater than the gate length of the gate electrode 7 for the low voltage transistor.

Figure 5H:
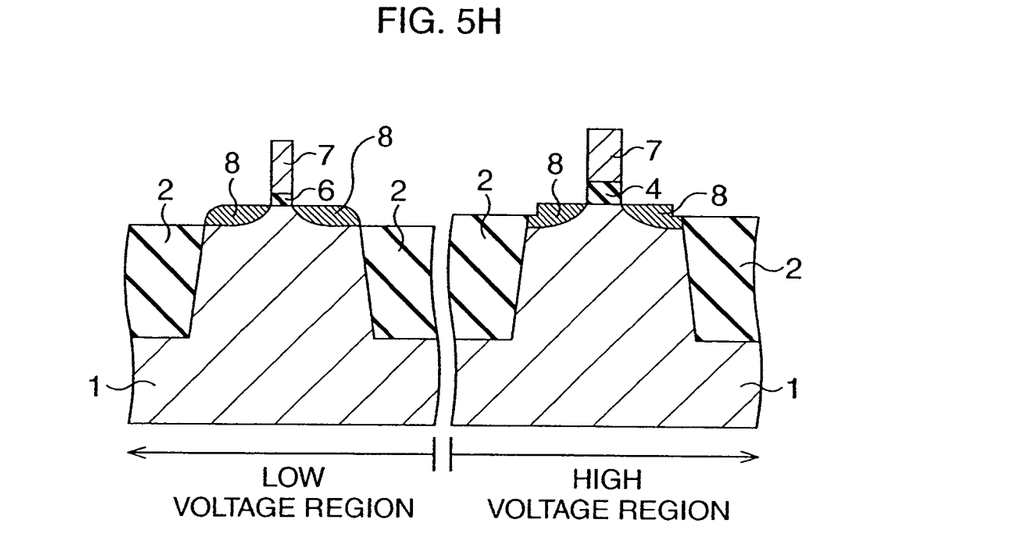

Thereafter, as shown in FIG. 5H, extension layers 8 are formed on the surfaces of the active regions 3 beside the gate electrodes 7 by ion-implantation.

Figure 5I:
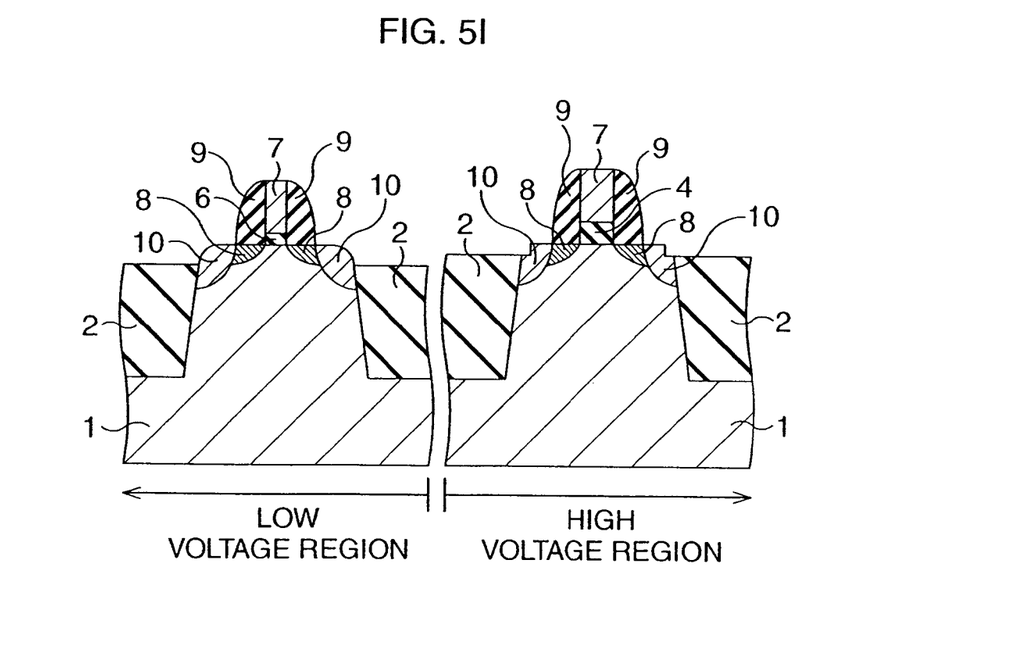

Subsequently, an insulating film is formed on the entire surface and etched-back to thereby form side walls 9 beside the gate electrodes 7 as shown in FIG. 5I. Then, source-drain diffusion layers (SD diffusion layers) 10 are formed by ion-implantation. Then, active annealing is performed to activate impurities in the extension layers 8 and impurities in the SD diffusion layers 10.

Figure 5J:
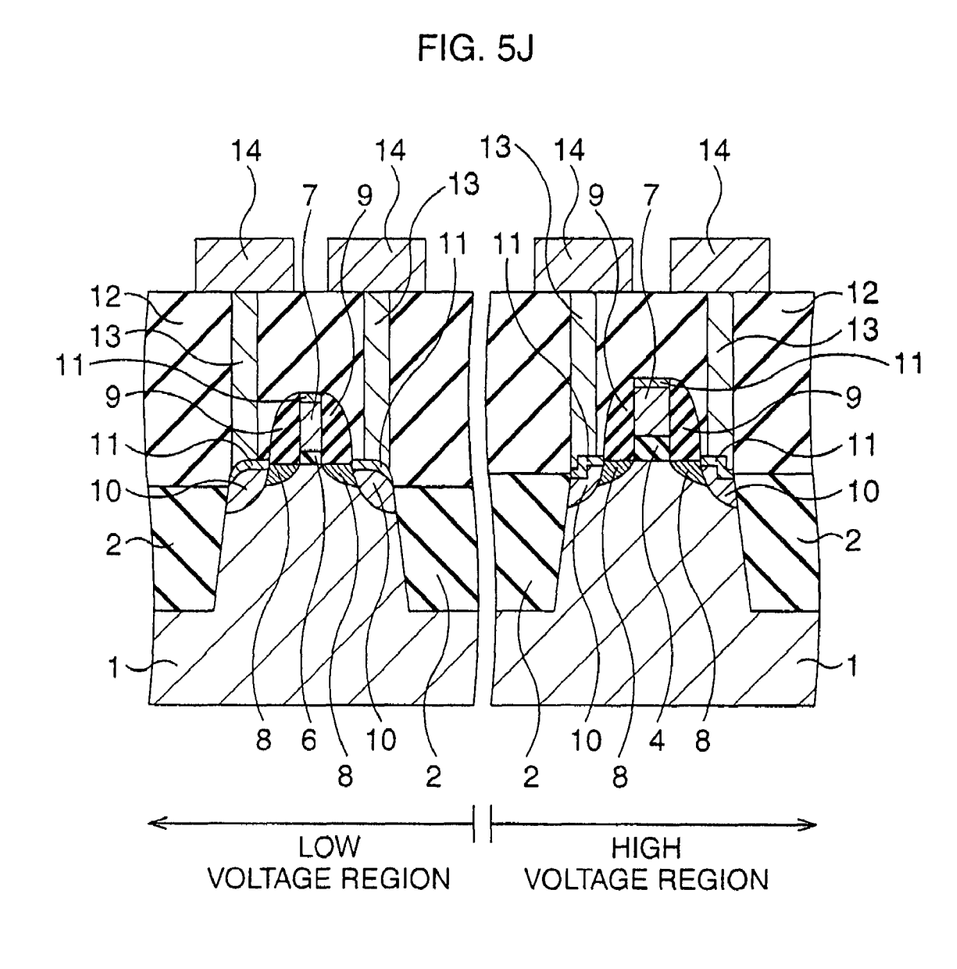

Then, as shown in FIG. 5J, silicide layers 11 are formed on the surfaces of the SD diffusion layers 10 and the gate electrodes 7. Thereafter, an interlayer insulating film 12 is formed on the entire surface and formed with contact holes. Subsequently, contact plugs 13 are buried in the contact holes, and wirings 14 are formed on the interlayer insulating film 12.

Thereafter, an upper layer wiring and so on are formed to complete a semiconductor device including two kinds of MOS transistors different in thickness of the gate insulating film.

According to the first embodiment as described above, combination of the intentional overetching of the element isolation insulating film 2 and RTH allows an effective large gate width to be secured while an electric field concentration is avoided, thereby, in turn, obtaining a large on-current.

Second Embodiment

Next, a second embodiment of the present invention will be described. FIG. 9A to FIG. 9F are cross-sectional views showing a method for manufacturing a semiconductor device according to the second embodiment of the present invention in the order of process steps. In the second embodiment, RTH is performed also on the high voltage transistor.

Figure 9A:
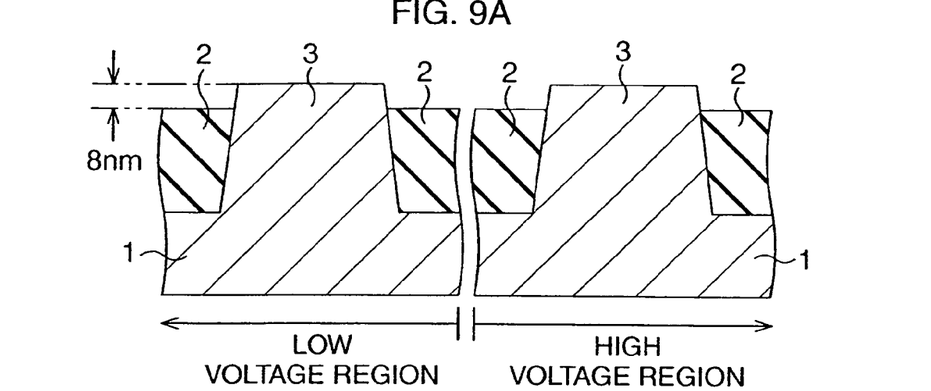
FIGS. 9A to 9F are cross-sectional views showing a method for manufacturing a semiconductor device according to a second embodiment of the present invention in the order of process steps.

In the second embodiment, first, as shown in FIG. 9A, element isolation insulating films 2 are formed on a semiconductor substrate, for example, a Si substrate 1 to thereby define active regions 3. In this event, the surfaces of the element isolation insulating films 2 may be at a position lower than the surfaces of the active regions 3 by, for example, about 8 nm.

Figure 9B:
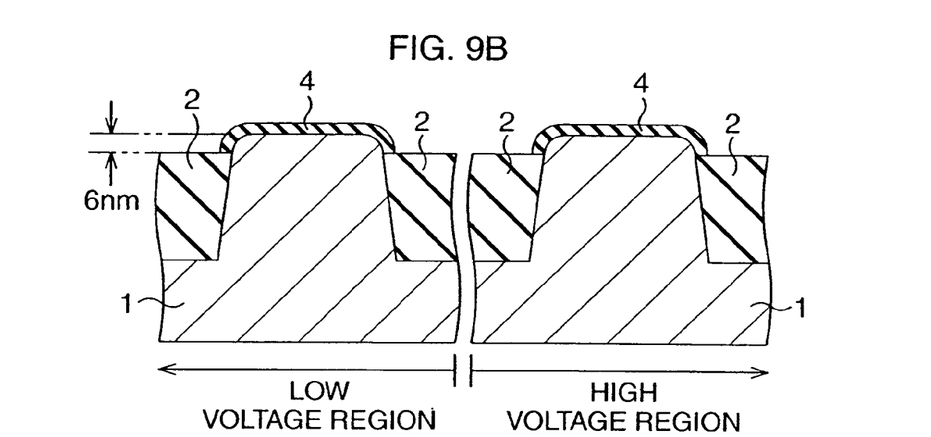

Next, RTH is performed on respective regions 3a within the high voltage region and the low voltage region. As a result of this, as shown in FIG. 9B, a natural oxide film is removed from the surfaces of the active regions 3 so that the flatness of the active regions 3 is increased, and theirs corners are rounded. Subsequently, as shown in FIG. 9B, gate insulating films 4 for the high voltage transistor are formed on the surfaces of the active regions 3 within the low voltage region and the high voltage region by thermal oxidation. The thickness of the gate insulating film 4 may be, for example, 5 nm. This thermal oxidation consumes Si existing on the surfaces of the active regions 3 by about 2 nm. Accordingly, the difference between the surface of the active region 3 and the surface of the element isolation insulating film 2 becomes about 6 nm.

Figure 9C:
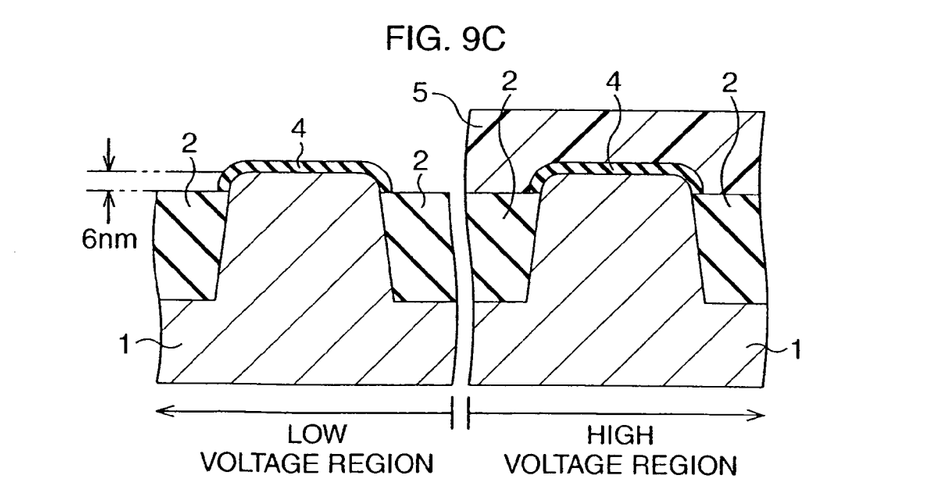

Then, as shown in FIG. 9C, a resist pattern 5 exposing the low voltage region and covering the high voltage region is formed.

Figure 9D:
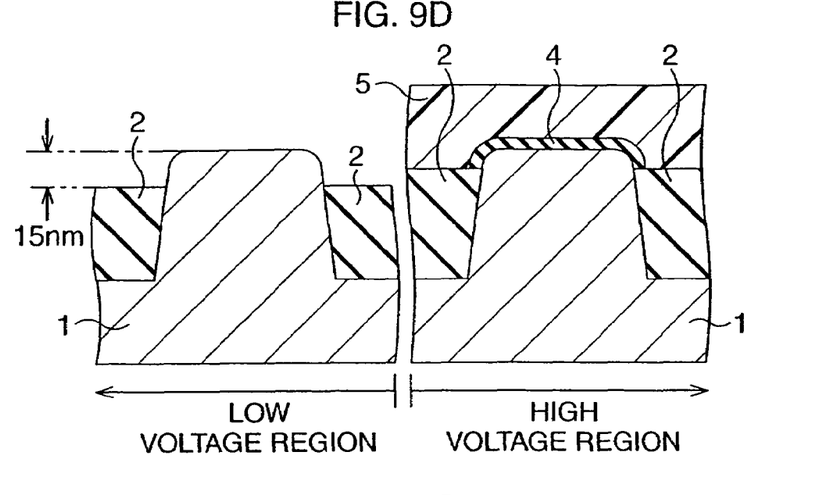

Subsequently, as shown in FIG. 9D, wet etching using, for example, hydrofluoric acid is performed with the resist pattern 5 used as a mask to thereby remove the gate insulating film 4 existing within the low voltage region. In this event, the etching is not finished upon exposure of the active region 3, but overetching is performed until the surface of the element isolation insulating film 2 becomes lower by, for example, about 15 nm than the surface of the active region 3 within the low voltage region. To perform such an overetching, it is only required to perform wet etching under the condition, for example, for removing the thermal oxidation film by 6 nm, that is, for removing the element isolation insulating film 2 by 9 nm.

Figure 9E:
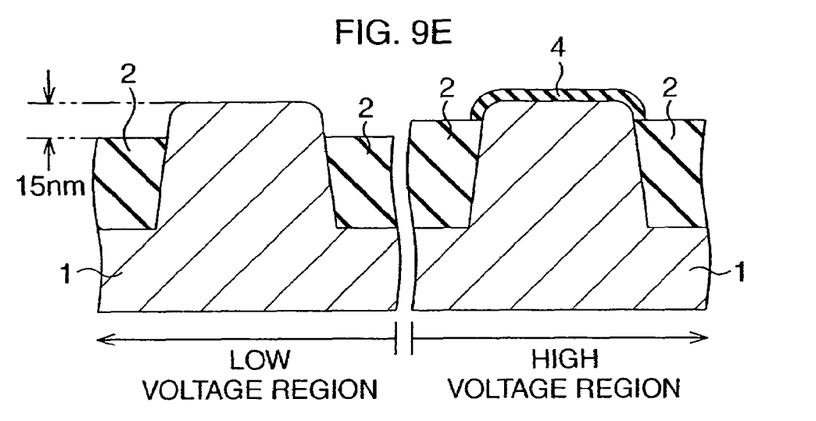

Subsequently, as shown in FIG. 9E, the resist pattern 5 is removed, and RTH is performed only on the active region 3 within the low voltage region. As a result of this, a natural oxide film is removed from the surface of the active region 3 within the low voltage region so that the flatness of the active region 3 is increased, and its corners are more rounded.

Figure 9F:
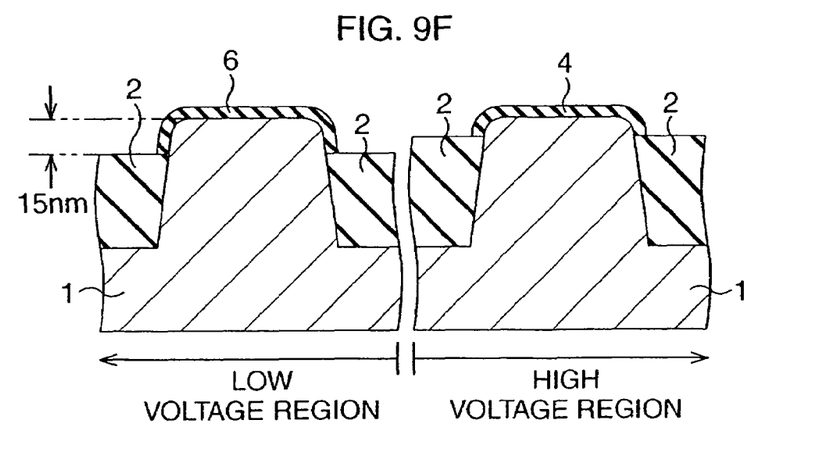

Then, as shown in FIG. 9F, a gate insulating film 6 for the low voltage operation transistor is formed on the surface of the active region 3 within the low voltage region by thermal oxidation. The thickness of the gate insulating film 6 may be, for example, 1.8 nm.

Thereafter, the processing after the formation of the gate electrodes is performed in a manner similar to that in the first embodiment to complete a semiconductor device.

According to the second embodiment as described above, the same effect as that of the first embodiment can be obtained. Further, higher effects can be obtained for the low voltage region because of performance of twice RTH.

Third Embodiment

Figure 10A:
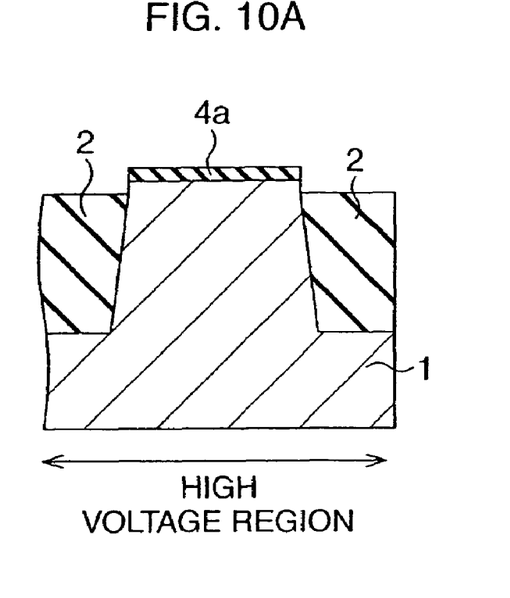
FIG. 10A is a cross-sectional view showing a relatively thin gate insulating film for a high voltage transistor.
Figure 10B:
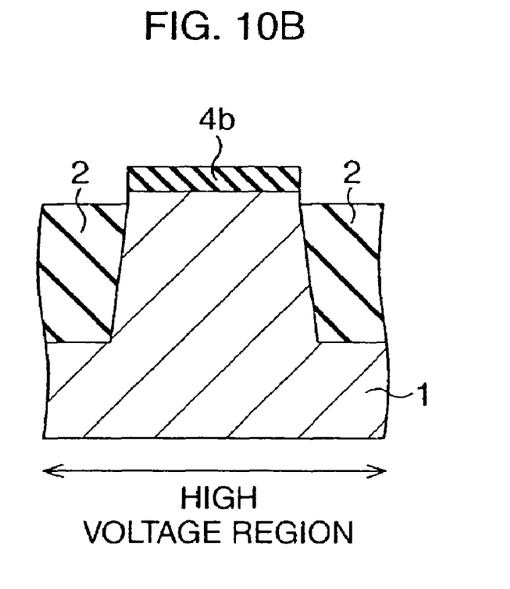
FIG. 10B is a cross-sectional view showing a relatively thick gate insulating film for a high voltage transistor.

Next, a third embodiment of the present invention will be described. Manufacturing of such a plurality of kinds of semiconductors may be generally demanded that operation voltages of low voltage transistors are equal but operation voltages of high voltage transistors are different. In such a case, the thicknesses of their gate insulating films for the high voltage transistors will be different, leading to different Si-consumptions within active regions in forming the gate insulating films. For example, the Si-consumption when forming a 3 nm-gate insulating film 4a for a high voltage transistor is about 1.35 nm as shown in FIG. 10A, while the Si-consumption when forming a 7.45 nm-gate insulating film 4b under the same conditions is about 3.35 nm as shown in FIG. 10B. As a result of this, there occurs a difference of 2 nm between the active region and the element isolation insulating film after the formation of the gate oxide film. Accordingly, overetching performed on all of them under the same condition causes unfixed steps within the low voltage regions, leading to a difference in characteristics of the low transistors.

Hence, in the third embodiment, the amount of the surface lowering within the active region when forming the gate insulating film for the high voltage transistor is obtained in advance, and the degree of overetching is controlled in accordance with the amount. Hereinafter, a method for manufacturing a first semiconductor device which comprises a low voltage transistor having a gate insulating film with a thickness of 1.8 nm and a high voltage transistor having a gate insulating film with a thickness of 3 nm, and a method for manufacturing a second semiconductor device which comprises a low voltage transistor having a gate insulating film with a thickness of 1.8 nm and a high voltage transistor having a gate insulating film with a thickness of 7.45 nm will be described.

Figure 11A:
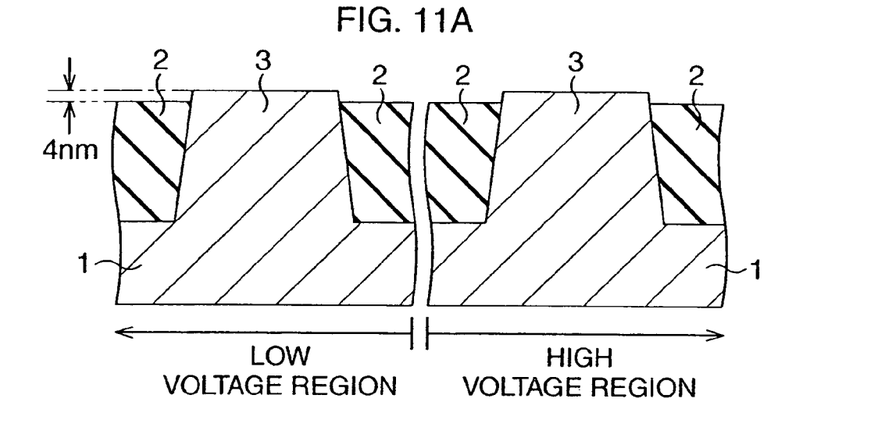
FIGS. 11A to 11C are cross-sectional views showing a method for manufacturing a semiconductor device (a portion of a first semiconductor device) according to a third embodiment of the present invention in the order of process steps.

To manufacture the first semiconductor device, first, element isolation insulating films 2 are formed on a semiconductor substrate, for example, a Si substrate 1 to thereby define active regions 3 as shown in FIG. 11A. In this event, the surfaces of the element isolation insulating films 2 may be at a position lower than the surfaces of the active regions 3 by, for example, 4 nm.

Figure 11B:
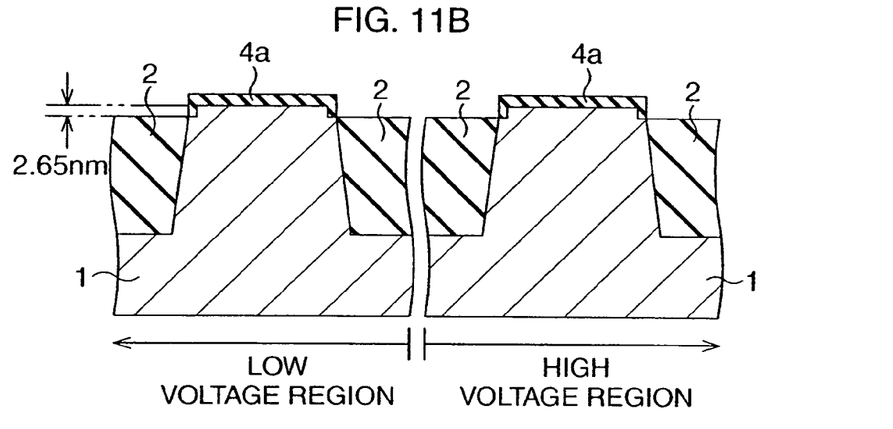

Next, as shown in FIG. 11B, the gate insulating films 4a for the high voltage transistor are formed on the surfaces of the active regions 3 within the low voltage region and the high voltage region by thermal oxidation. The thickness of the gate insulating film 4a may be 3 nm. This thermal oxidation consumes Si existing on the surfaces of the active regions 3 by about 1.35 nm. Accordingly, the difference between the surface of the active region 3 and the surface of the element isolation insulating film 2 becomes about 2.65 nm. Note that the Si-consumption is preferably measured in advance.

Figure 11C:
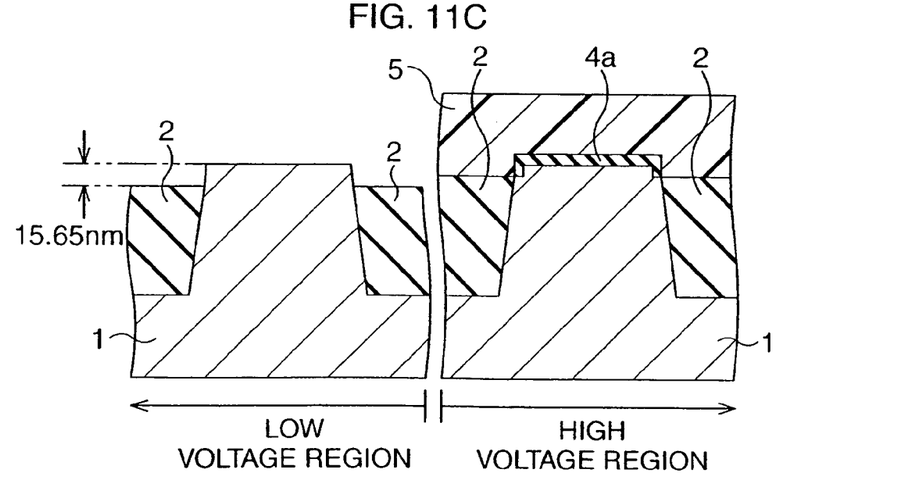

Then, as shown in FIG. 11C, a resist pattern 5 exposing the low voltage region and covering the high voltage region is formed. Thereafter, wet etching using, for example, hydrofluoric acid is performed with the resist pattern used 5 as a mask to thereby remove the gate insulating film 4a existing within the low voltage region. In this event, the overetching is performed until the surface of the element isolation insulating film 2 becomes lower by, for example, about 15.65 nm than the surface of the active region 3. To perform such an overetching, it is only required to perform wet etching under the condition, for example, for removing the thermal oxide film by 8.5 nm, that is, for removing the element isolation insulating film 2 by 13 nm. Note that the condition of the wet etching may be determined in accordance with the Si-consumption.

Figure 12A:
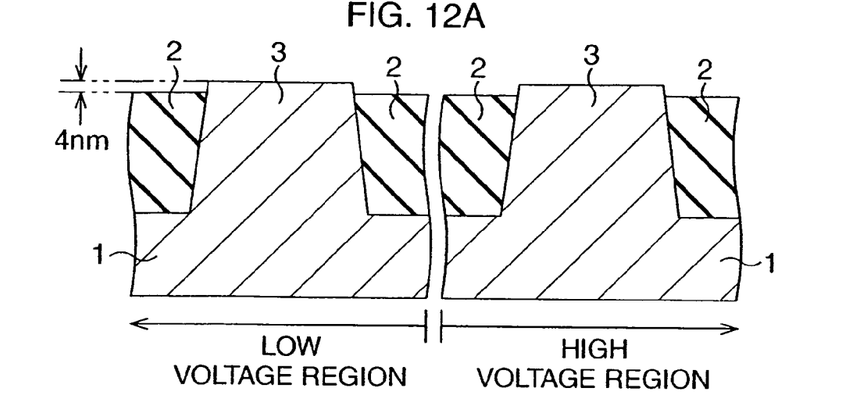
FIGS. 12A to 12C are cross-sectional views showing a method for manufacturing a semiconductor device (a portion of a second semiconductor device) according to the third embodiment of the present invention in the order of process steps.

On the other hand, to manufacture the second semiconductor device, first, element isolation insulating films 2 are formed on a Si-substrate 1 to thereby define active regions 3 as shown in FIG. 12A.

Figure 12B:
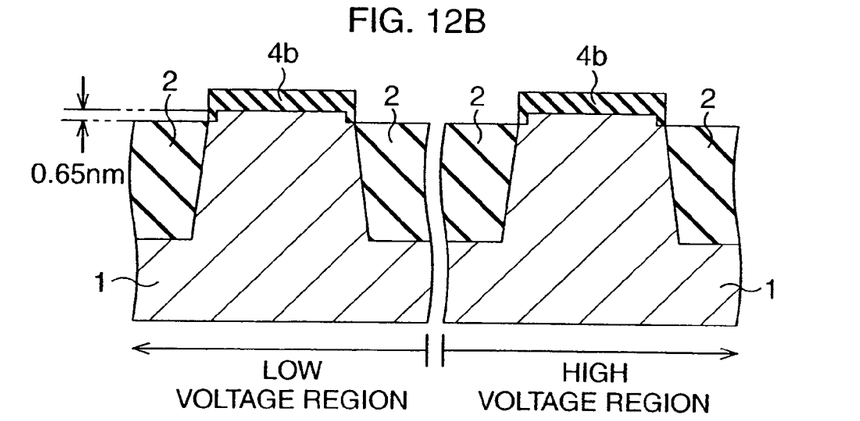

Next, as shown in FIG. 12B, the gate insulating films 4b for the high voltage transistor are formed on the surfaces of the active regions 3 within the low voltage region and the high voltage region by thermal oxidation. The thickness of the gate insulating film 4b may be 7.45 nm. This thermal oxidation consumes Si existing on the surfaces of the active regions 3 by about 3.35 nm. Accordingly, the difference between the surface of the active region 3 and the surface of the element isolation insulating film 2 becomes about 0.65 nm. Note that the Si-consumption is preferably measured in advance.

Figure 12C:
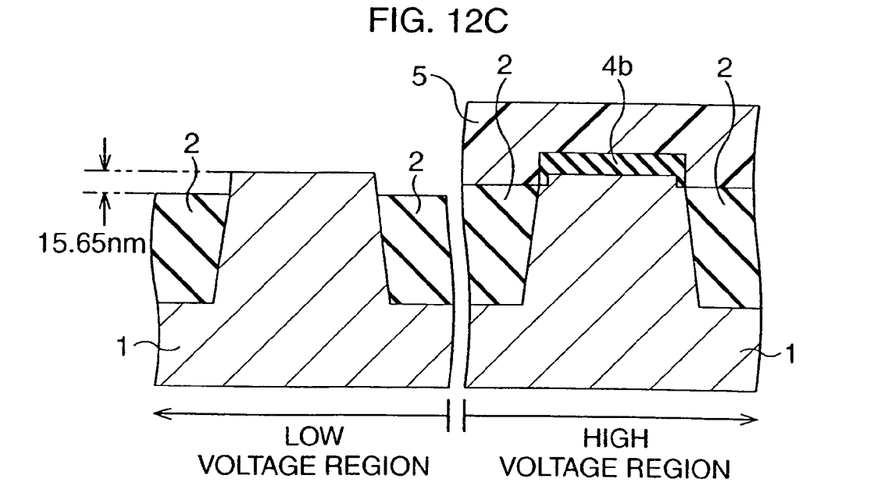

Then, as shown in FIG. 12C, a resist pattern 5 exposing the low voltage region and covering the high voltage region is formed. Thereafter, wet etching using, for example, hydrofluoric acid is performed with the resist pattern 5 used as a mask to thereby remove the gate insulating film 4b existing within the low voltage region. In this event, the overetching is performed until the surface of the element isolation insulating film 2 becomes lower by, for example, about 15.65 nm than the surface of the active region 3. To perform such an overetching, it is only required to perform wet etching under the condition, for example, for removing the thermal oxide film by 10 nm, that is, for removing the element isolation insulating film 2 by 15 nm. Note that the condition of the wet etching may be determined in accordance with the Si-consumption.

According to the third embodiment as described above, the characteristics of the high voltage transistor can be adjusted to be predetermined as necessary while the characteristics of the low voltage transistor are kept fixed in various semiconductor devices.

According to the present invention, a step existing between the first active region and the element isolation insulating film allows a wide effective channel width to be secured. Therefore, a sufficient on-current can be ensured. In particular, when a high-temperature rapid thermal hydrogen treatment is performed, a larger on-current can be obtained due to movement of Si atoms.

What is claimed is:

1. A method for manufacturing a semiconductor device, comprising the steps of:
    forming an element isolation insulating film which defines a first and a second active regions on a surface of a semiconductor substrate;
    forming a first gate insulating film within the first and second active regions; removing the first gate insulating film within the first active region and lowering a surface of the element isolation insulating film surrounding the first active region than a surface of the first active region;
    forming a second gate insulating film thinner than the first gate insulating film, within the first active region; and
    forming gate electrodes on the first and second gate insulating films.

2. The method for manufacturing a semiconductor device according to claim 1, wherein said step of forming the first field effect transistor comprises a step of forming a gate insulating film with a thickness of 2 nm or less.

3. The method for manufacturing a semiconductor device according to claim 1, wherein a step between the surface of the element isolation insulating film and the surface of the first active region ranges from 5 nm to 20 nm.

4. The method for manufacturing a semiconductor device according to claim 1, further comprising the step of, before forming the first and second field effect transistors, performing a high-temperature rapid thermal hydrogen treatment on the first active region and the second active region.

5. The method for manufacturing a semiconductor device according to claim 1, wherein said step of lowering the surface of the element isolation insulating film than the surface of the first active region comprises the step of etching the element isolation insulating film in accordance with a silicon amount within the first active region consumed in forming the first gate insulating film.

6. A method for manufacturing a semiconductor device, comprising the steps of: forming an element isolation insulating film defines a first and a second active regions on a surface of a semiconductor substrate; forming a first gate insulating film within the first and second active regions; removing the first gate insulating film within the first active region and lowering a surface of the element isolation insulating film surrounding the first active region than a surface of the first active region; performing thermal treatment on the first active region; forming a second gate insulating film thinner than the first gate insulating film, within the first active region; and forming gate electrodes on the first and second gate insulating films.

7. The method for manufacturing a semiconductor device according to claim 6, further comprising the step of, between said step of forming the element isolation insulating film and said step of forming the first gate insulating film, performing a high-temperature rapid thermal hydrogen treatment on the first and second active regions.

8. The method for manufacturing a semiconductor device according to claim 6, a thickness of the second gate insulating film is 2 nm or less.

9. The method for manufacturing a semiconductor device according to claim 6, wherein a step between the surface of the element isolation insulating film and the surface of the first active region ranges from 5 nm to 20 nm.

10. The method for manufacturing a semiconductor device according to claim 6, wherein said step of lowering the surface of the element isolation insulating film than the surface of the first active region comprises the step of etching the element isolation insulating film in accordance with a silicon amount within the first active region consumed in forming the first gate insulating film.

11. The method for manufacturing a semiconductor device according to claim 6, wherein the thermal treatment on the first active region is performed under a hydrogen atmosphere.

* * * * *